United States Patent
Cheng et al.

(10) Patent No.: US 10,199,278 B2
(45) Date of Patent: Feb. 5, 2019

(54) VERTICAL FIELD EFFECT TRANSISTOR (FET) WITH CONTROLLABLE GATE LENGTH

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/608,159

(22) Filed: May 30, 2017

(65) Prior Publication Data
US 2018/0350695 A1   Dec. 6, 2018

(51) Int. Cl.
  *H01L 21/8234* (2006.01)
  *H01L 29/78* (2006.01)
  *H01L 29/10* (2006.01)

(52) U.S. Cl.
  CPC ........ *H01L 21/823487* (2013.01); *H01L 21/823437* (2013.01); *H01L 29/1037* (2013.01); *H01L 29/7827* (2013.01)

(58) Field of Classification Search
  CPC ..... H01L 21/823487; H01L 21/823437; H01L 29/7827; H01L 29/1037
  See application file for complete search history.

(56) References Cited

U.S. PATENT DOCUMENTS

| | | |
|---|---|---|
| 6,846,709 B1 | 1/2005 | Lojek |
| 7,446,025 B2 | 11/2008 | Cohen et al. |
| 7,683,428 B2 | 3/2010 | Chidambarrao et al. |
| 8,080,458 B2 | 12/2011 | Masuoka et al. |
| 8,637,849 B2 | 1/2014 | Deligianni et al. |

(Continued)

FOREIGN PATENT DOCUMENTS

| | | |
|---|---|---|
| CN | 100570894 C | 12/2009 |
| WO | 2005079182 A2 | 9/2005 |

OTHER PUBLICATIONS

F.S.M. Hashemi et al., "Self-Correcting Process for High Quality Patterning by Atomic Layer Deposition," ACS Nano, Jul. 24, 2015, pp. 8710-8717, vol. 9, No. 9.

(Continued)

*Primary Examiner* — Steven Loke
*Assistant Examiner* — Juanita Rhodes
(74) *Attorney, Agent, or Firm* — Vazken Alexanian; Ryan, Mason & Lewis, LLP

(57) ABSTRACT

A method for manufacturing a semiconductor device includes forming a plurality of fins on a substrate, wherein a hardmask is formed on each of the plurality of fins, forming a gate structure around the plurality of fins, selectively depositing a dummy dielectric on the hardmask on each of the plurality of fins, depositing a dielectric layer on the gate structure and around the dummy dielectrics, selectively removing the dummy dielectrics and the hardmasks with respect to the dielectric layer and the gate structure to create a plurality of openings exposing portions of the gate structure, and selectively removing the exposed portions of the gate structure through the plurality of the openings.

17 Claims, 6 Drawing Sheets

(56) References Cited

U.S. PATENT DOCUMENTS 8,815,344 B2  8/2014 Ma
2005/0164454 A1* 7/2005 Leslie ............... H01L 27/10876
438/269

OTHER PUBLICATIONS

U.S. Appl. No. 14/970,624, filed Dec. 16, 2015 and entitled "Variable Gate Lengths for Vertical Transistors."
U.S. Appl. No. 15/196,774, filed Jun. 29, 2016 and entitled "Vertical Transistor with Variable Gate Length."
U.S. Appl. No. 15/206,939, filed Jul. 11, 2016 and entitled "Gate Length Controlled Vertical FETs."

* cited by examiner

VERTICAL FIELD EFFECT TRANSISTOR (FET) WITH CONTROLLABLE GATE LENGTH

TECHNICAL FIELD

The field generally relates to semiconductor devices and methods of manufacturing same and, in particular, to preventing variations in gate length for vertical transistors.

BACKGROUND

Vertical field effect transistors (VFETs) are becoming viable device options for semiconductor devices, for example, complementary metal oxide semiconductor (CMOS) devices, beyond 5 nm node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region.

VFETs decouple gate length (Lg) with the device footprint. The Lg of VFETs is controlled by the gate metal height. Accordingly, variations in gate metal height lead to differences in Lg.

SUMMARY

According to an exemplary embodiment of the present invention, a method for manufacturing a semiconductor device includes forming a plurality of fins on a substrate, wherein a hardmask is formed on each of the plurality of fins, forming a gate structure around the plurality of fins, selectively depositing a dummy dielectric on the hardmask on each of the plurality of fins, depositing a dielectric layer on the gate structure and around the dummy dielectrics, selectively removing the dummy dielectrics and the hardmasks with respect to the dielectric layer and the gate structure to create a plurality of openings exposing portions of the gate structure, and selectively removing the exposed portions of the gate structure through the plurality of the openings.

According to an exemplary embodiment of the present invention, a semiconductor device includes a vertical transistor on a substrate, wherein the vertical transistor includes at least one fin, and a gate structure formed around the at least one fin, wherein a gate length is the same or substantially the same on each side of the at least one fin.

According to an exemplary embodiment of the present invention, a method for manufacturing a semiconductor device includes forming a plurality of fins on a substrate, wherein a hardmask is formed on each of the plurality of fins, forming a gate structure around the plurality of fins, selectively depositing a dummy dielectric on the hardmask on each of the plurality of fins, depositing a dielectric layer on the gate structure and around the dummy dielectrics, selectively removing the dummy dielectrics and the hardmasks with respect to the dielectric layer and the gate structure to create a plurality of openings exposing portions of the gate structure, and recessing the exposed portions of the gate structure through the plurality of the openings to the same or substantially the same height around each of the plurality of fins.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
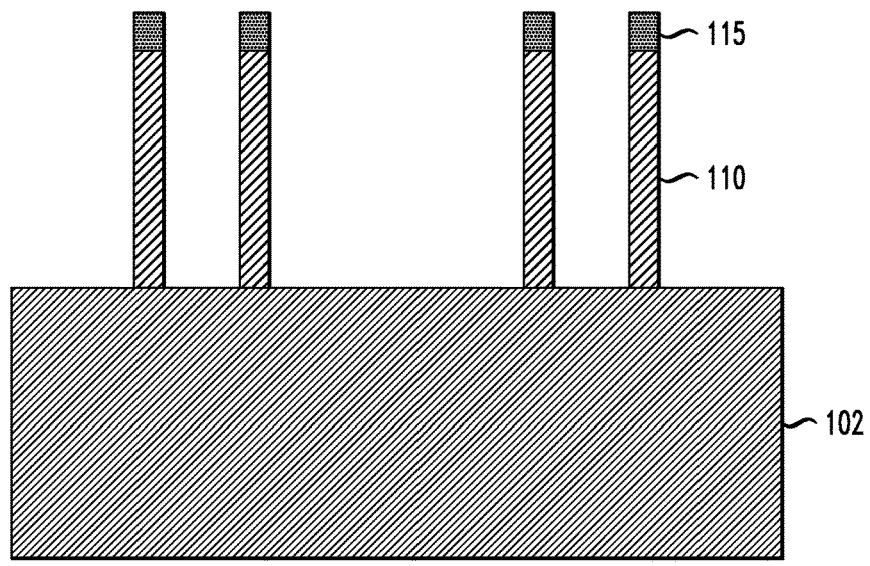
FIG. 1 is a cross-sectional view of fin formation in a method of manufacturing a semiconductor device, according to an exemplary embodiment of the present invention.

Exemplary embodiments of the invention will now be discussed in further detail with regard to semiconductor devices and methods of manufacturing same and, in particular, to controlling recessing of a gate structure to result in uniform vertical transistor gate lengths.

It is to be understood that the various layers and/or regions shown in the accompanying drawings are not drawn to scale, and that one or more layers and/or regions of a type commonly used in, for example, a complementary metal-oxide semiconductor (CMOS), nanowire field-effect transistor (FET), fin field-effect transistor (FinFET), metal-oxide-semiconductor field-effect transistor (MOSFET), VFET, single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, VFETs, nanowire FETs, nanosheet FETs, SETs, CMOSs, MOSFETs and/or FinFETs. By way of non-limiting example, the semiconductor devices can include, but are not limited to VFET, nanowire FET, nanosheet FET, SET, CMOS, MOSFET and FinFET devices, and/or semiconductor devices that use CMOS, MOSFET, VFET, nanowire FET, nanosheet FET, SET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the cross-sectional views measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the three-dimensional and/or cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

As used herein, "cut" or "cutting" refers to removal of a portion of a material referred to as being cut. For example, cutting of a fin and/or a gate structure refers to removal of a portion of the fin and/or gate structure, by, for example, a removal process, such as, but not necessarily limited to, etching.

The gate length (Lg) of VFETs is controlled by the gate metal height. Controlling the gate metal height by metal deposition followed by etching processes can be difficult. For example, variations in amounts of portions of a gate structure that are recessed leads to Lg variation. The variation can be caused by different etch rates of the gate structures caused by gate trenches having different dimensions (referred to herein as a "loading effect"). For example, a dimension of an exposed gate structure in a trench that is to be etched may be different than the dimension of another exposed gate structure in another trench that also is to be etched. Due to the different dimension of the exposed gate structures, the etch rates will differ between the exposed gate structures, leading a different resulting gate heights. For example, a wider exposed area will be etched to a lower height than a thinner exposed area, resulting in a smaller gate length (Lg) corresponding to the wider exposed area.

Embodiments of the present invention provide methods and structures for minimizing or eliminating variations in gate length for vertical transistors by minimizing or eliminating loading effect. More specifically, embodiments of the present invention use selective deposition of a dummy dielectric on a hardmask, and selective removal of the dummy dielectric and hardmask to create uniform or substantially uniform openings exposing portions of a gate structure to be etched. Accordingly, etching performed via the equal or substantially equal sized openings will result in uniform or substantially uniform removal of the exposed portions of the gate structure for different vertical transistors so that the gate structures will be uniformly recessed and Lg between the different vertical transistors will be the same or substantially the same. As used herein, "substantially the same," "substantially uniform," or "substantially equal" can be considered to be within, for example, ±2 nm difference between resulting recessed gate structure heights, or ±3 nm difference between resulting widths of the openings exposing portions of a gate structure to be etched.

FIG. 1 is a cross-sectional view of fin formation in a method of manufacturing a semiconductor device, according to an exemplary embodiment of the present invention. Referring to FIG. 1, a semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 102 can be a bulk substrate or a silicon-on-insulator (SOI) substrate including a buried insulating layer, such as, for example, a buried oxide or nitride layer.

Fins, such as fins 110, can be formed by patterning a semiconductor layer into the fins 110. The semiconductor layer can include, but is not necessarily limited to, Si, SiGe or III-V materials, and may be epitaxially grown. According to an embodiment, a hardmask 115 including, for example, a dielectric material, such as silicon nitride (SiN) is formed on portions of the semiconductor layer that are to be formed into the fins 110. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (ME) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. While embodiments of the present invention describe channel regions as fins, the embodiments are not necessarily limited to fin channel regions, and may include nanowire channel regions. In addition, although four fins 110 are shown in the figures for ease of explanation, more or less than four fins can be formed.

Figure 2:
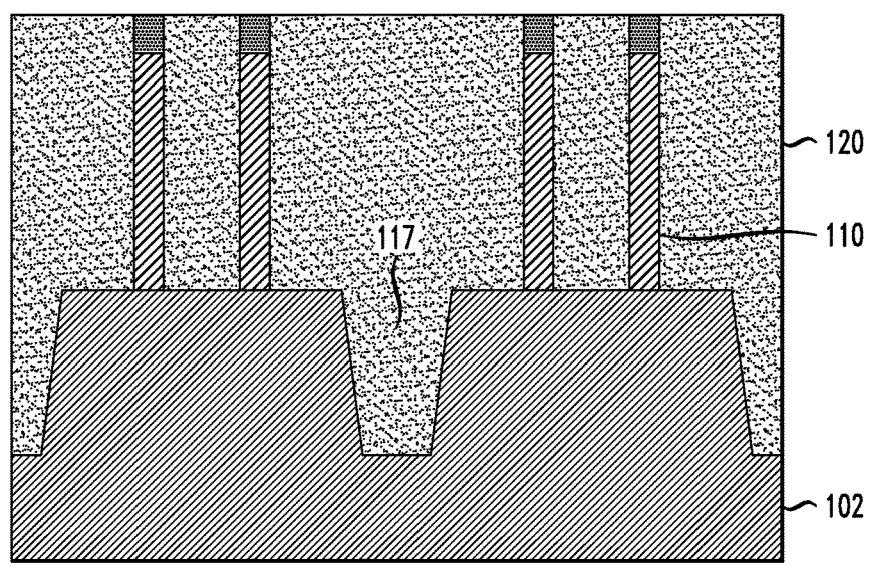
FIG. 2 is a cross-sectional view illustrating dielectric layer deposition and formation of isolation regions in a method of manufacturing a semiconductor device, according to an exemplary embodiment of the present invention.

FIG. 2 is a cross-sectional view illustrating dielectric layer deposition and formation of isolation regions in a method of manufacturing a semiconductor device, according to an exemplary embodiment of the present invention. Referring to FIG. 2, trenches 117 are formed in the substrate 102, by for example, a wet or dry etch process. A dielectric material layer 120, including, but not necessarily limited to silicon dioxide ($SiO_2$), low-temperature oxide (LTO), high-temperature oxide (HTO), flowable oxide (FOX) or some other dielectric, is formed on the substrate 102 and in the trenches 117, and around the fins 110. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process down to the hardmask 115, such as, chemical mechanical planarization (CMP) to remove excess dielectric material.

Figure 3:
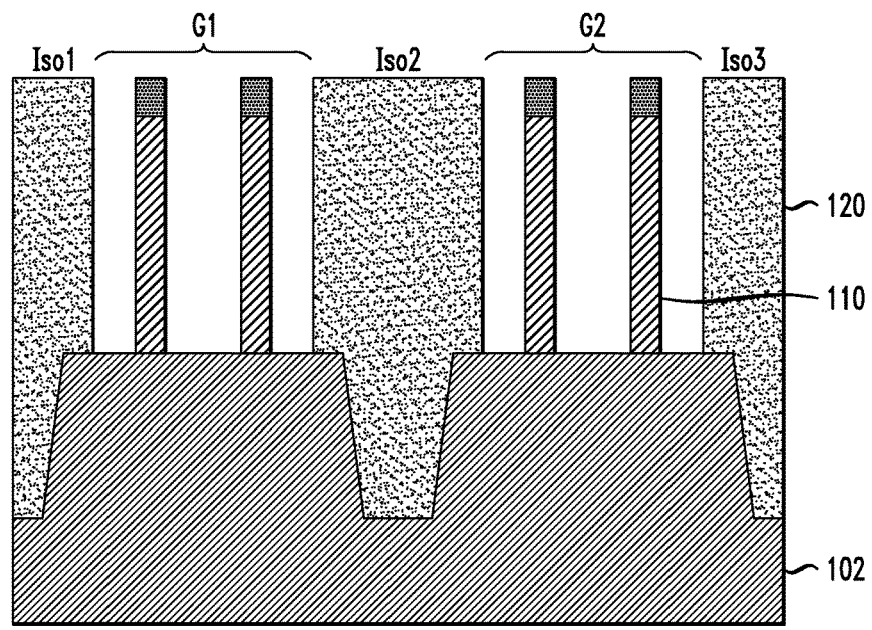
FIG. 3 is a cross-sectional view of patterning the dielectric layer into gate and isolation regions in a method of manufacturing a semiconductor device, according to an exemplary embodiment of the present invention.

FIG. 3 is a cross-sectional view of patterning the dielectric layer into gate and isolation regions in a method of manufacturing a semiconductor device, according to an exemplary embodiment of the present invention. Referring to FIG. 3, portions of the dielectric layer 120 are removed from around the fins 110 in what are the gate regions G1 and G2. The removal of the portions of the dielectric layer 120 from the gate regions G1 and G2 defines isolation regions Iso1, Iso2 and Iso3, such as, for example, shallow trench isolation (STI) regions. The patterning of the dielectric layer can be performed using appropriate masking and removal techniques, including, but not necessarily limited to, RIE and optical lithography.

Figure 4:
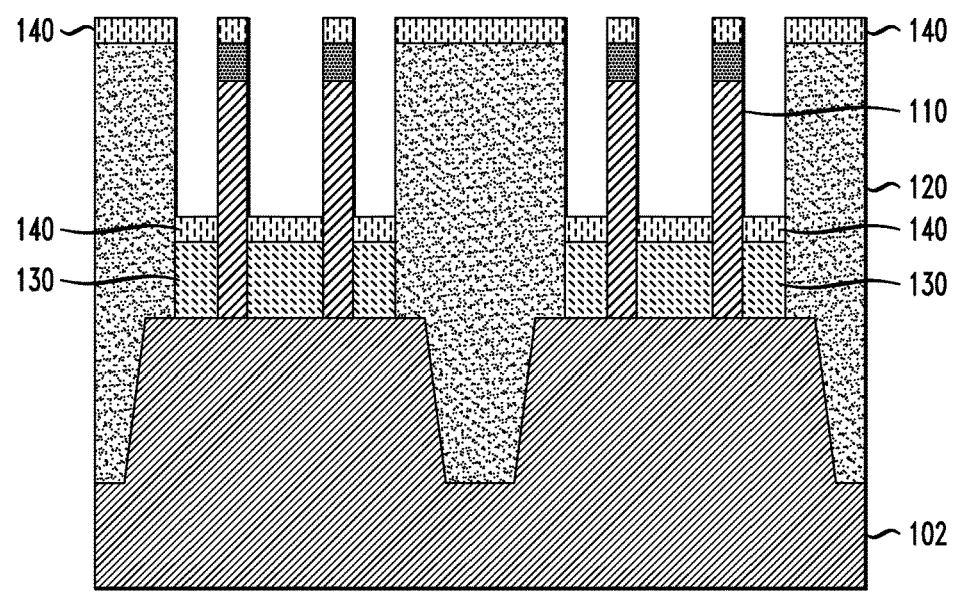
FIG. 4 is a cross-sectional view of bottom source/drain and bottom spacer formation in a method of manufacturing a semiconductor device, according to an exemplary embodiment of the present invention.

FIG. 4 is a cross-sectional view of bottom source/drain and bottom spacer formation in a method of manufacturing a semiconductor device, according to an exemplary embodiment of the present invention. Referring to FIG. 4, bottom source/drain regions 130 are formed in the gate regions G1 and G2 around the fins 110. The bottom source/drain regions 130 can be formed by a bottom-up epitaxial growth process, wherein the bottom source/drain regions 130 are grown to certain height (thickness) such as, but not necessarily limited to about 10 nm to about 50 nm. The epitaxially grown bottom source/drain regions 130 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1e18/cm^3$ to $1e21/cm^3$.

Spacer material 140 is formed on exposed horizontal surfaces including isolation regions Iso1, Iso2 and Iso3, the bottom source/drain regions 130 and on the hardmasks 115, which are on the fins 110. Spacer material 140 includes, but is not necessarily limited to, low-K dielectric layers, including, but not limited to, SiBCN, SiOCN, SiN or $SiO_2$, deposited using, for example, directional deposition techniques, including, but not necessarily limited to high density plasma (HDP) deposition and gas cluster ion beam (GCM) deposition. The directional deposition deposits the spacer material on the exposed horizontal surfaces, but not on lateral sidewalls. As explained herein below, the spacer material 140 formed on isolation regions Iso1, Iso2 and Iso3 and on the hardmasks 115 is removed, leaving the spacer material 140 on the bottom source/drain regions 130. The spacer material 140 on the bottom source/drain regions 130 is herein referred to as bottom spacer layers or bottom spacers 140.

Figure 5:
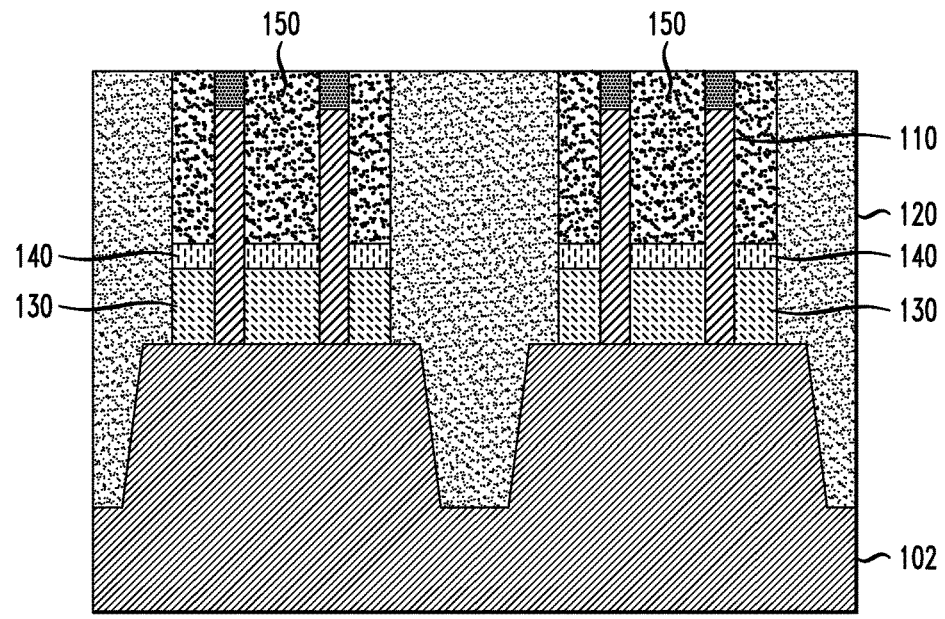
FIG. 5 is a cross-sectional view of gate structure formation in a method of manufacturing a semiconductor device, according to an exemplary embodiment of the present invention.

FIG. 5 is a cross-sectional view of gate structure formation in a method of manufacturing a semiconductor device, according to an exemplary embodiment of the present invention. A gate structure 150 is deposited on the spacer material 140 on and around the fins 110, and on the isolation regions Iso1, Iso2 and Iso3, using, for example, deposition techniques including, but not limited to, CVD, PECVD, RFCVD, PVD, ALD, MLD, MBD, PLD, LSMCD, sputtering, and/or plating. The gate structure 150 can include, for example, an interfacial dielectric layer including, but not necessarily limited to, $SiO_2$ (silicon dioxide), a high-K dielectric layer including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide), and a work-function metal (WFM) layer, including but not necessarily limited to, for a pFET, titanium nitride (TiN), tantalum nitride (TaN) or ruthenium (Ru), and for an nFET, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate structure includes a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof. A planarization process, such as, for example, CMP, is performed to remove excess portions of the gate structure 150 on the hardmasks 115, and on the isolation regions Iso1, Iso 2 and Iso3 to result in the structure shown in FIG. 5, where the gate structure 150 is on the bottom spacer layer 140 in the gate regions G1 and G2.

Figure 6:
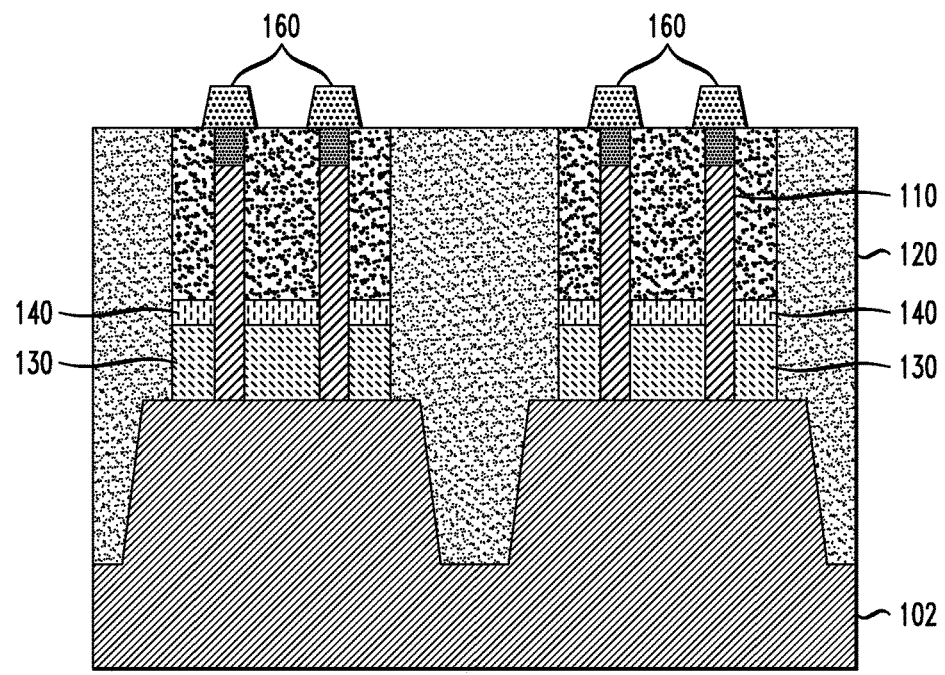
FIG. 6 is a cross-sectional view of selective deposition of a dummy dielectric in a method of manufacturing a semiconductor device, according to an exemplary embodiment of the present invention.

FIG. 6 is a cross-sectional view of selective deposition of a dummy dielectric in a method of manufacturing a semiconductor device, according to an exemplary embodiment of the present invention. Referring to FIG. 6, dummy dielectrics 160 are selectively deposited on the hardmasks 115. The hardmasks 115 include, for example, a nitride, such as SiN. The dummy dielectrics 160 include the same material as or a similar material to the hardmasks 115. For example, the dummy dielectrics are a nitride, such as SiN or other nitride-based material. The selective deposition of the dummy dielectrics 160 on the hardmasks can be performed using, for example selective atomic layer deposition (ALD) or selective chemical vapor deposition (CVD), or other selective deposition process on the hardmasks 115. The embodiments of the present invention are not necessarily limited to the illustrated shape of the dummy dielectrics 160.

Figure 7:
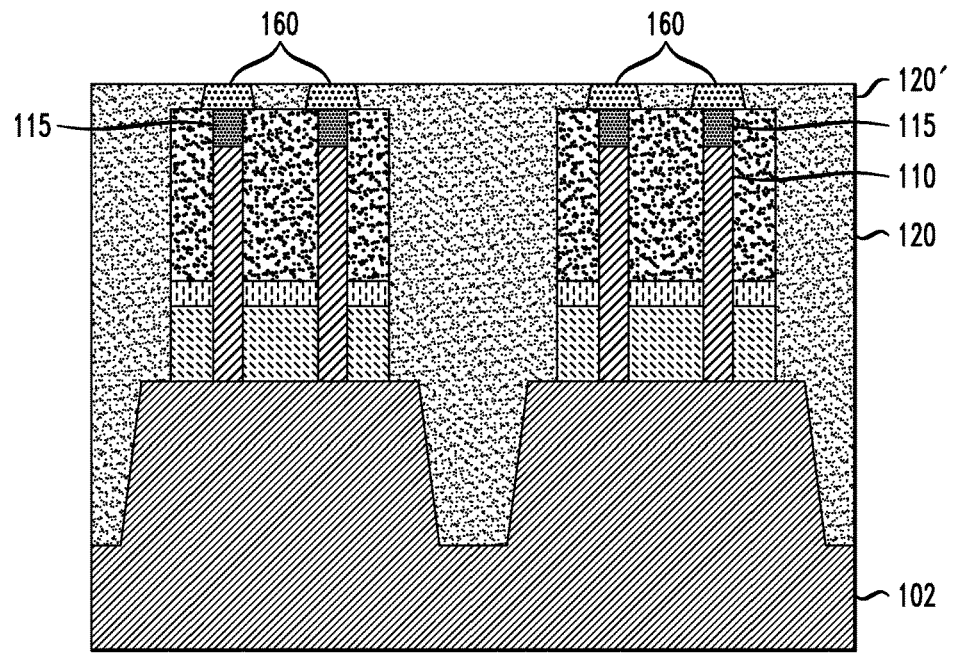
FIG. 7 is a cross-sectional view of additional dielectric deposition and planarization in a method of manufacturing a semiconductor device, according to an exemplary embodiment of the present invention.

FIG. 7 is a cross-sectional view of additional dielectric deposition and planarization in a method of manufacturing a semiconductor device, according to an exemplary embodiment of the present invention. Referring to FIG. 7, an additional dielectric layer 120' is deposited on the structure of FIG. 6, including on the dielectric layer 120, the gate structure 150 and on and around the dummy dielectrics 160. The additional dielectric layer 120' is planarized to the top of the dummy dielectrics 160 using, for example, CMP. As can be seen, top portions of the dummy dielectrics 160 may be removed during planarization, which decreases a height (thickness) of the dummy dielectrics 160. The additional dielectric layer 120' can include the same material as dielectric layer 120, such as, for example, an oxide, or a similarly based material, as long as the dummy dielectrics 160 and the hardmasks 115 can be selectively removed with respect to the dielectric layer 120' (or with respect to both dielectric layers 120, 120') and the gate structure 150 (explained further herein with respect to FIG. 8). The additional dielectric layer can be deposited using, for example, deposition techniques including, but not limited to, CVD, PECVD, RFCVD, PVD, ALD, MLD, MBD, PLD, LSMCD and/or sputtering.

Figure 8:
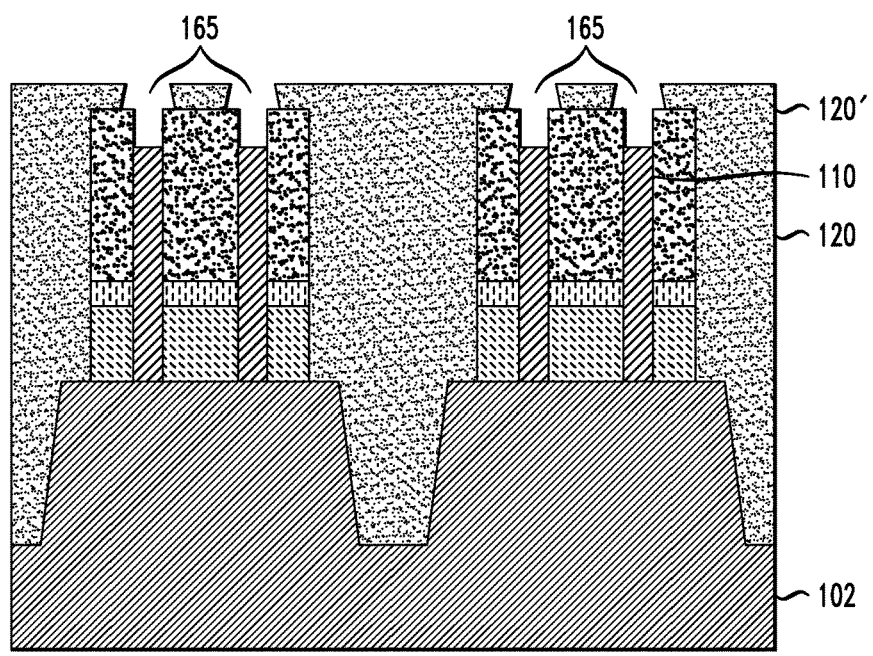
FIG. 8 is a cross-sectional view of selective removal of the dummy dielectric and hardmask in a method of manufacturing a semiconductor device, according to an exemplary embodiment of the present invention.

FIG. 8 is a cross-sectional view of selective removal of the dummy dielectric and hardmask in a method of manufacturing a semiconductor device, according to an exemplary embodiment of the present invention. Referring to FIG. 8, the dummy dielectrics 160 and the hardmasks 115 are selectively removed with respect to the dielectric layer 120' (or with respect to both dielectric layers 120, 120') and the gate structure 150 using, for example, a dry or wet etch process. According to an embodiment, the dummy dielectrics 160 and the hardmasks 115 are based with a different material than the dielectric layer 120' (or both dielectric layers 120, 120'). For example, the dummy dielectrics 160 and the hardmasks 115 are nitride based materials (e.g., SiN, SiBCN and SiOCN) which can be selectively removed with respect to the gate structure 150 and the oxide based dielectric layers 120 and 120'. The etch process can include, but is not necessarily limited to hot phosphoric acid.

As can be seen in FIG. 8, the selective removal of the dummy dielectrics 160 and the hardmasks 115 creates openings 165 having the same or substantially the same area to eliminate or minimize any loading effect that is caused by non-uniform openings exposing portions of the gate structure 150 to be recessed.

Figure 9:
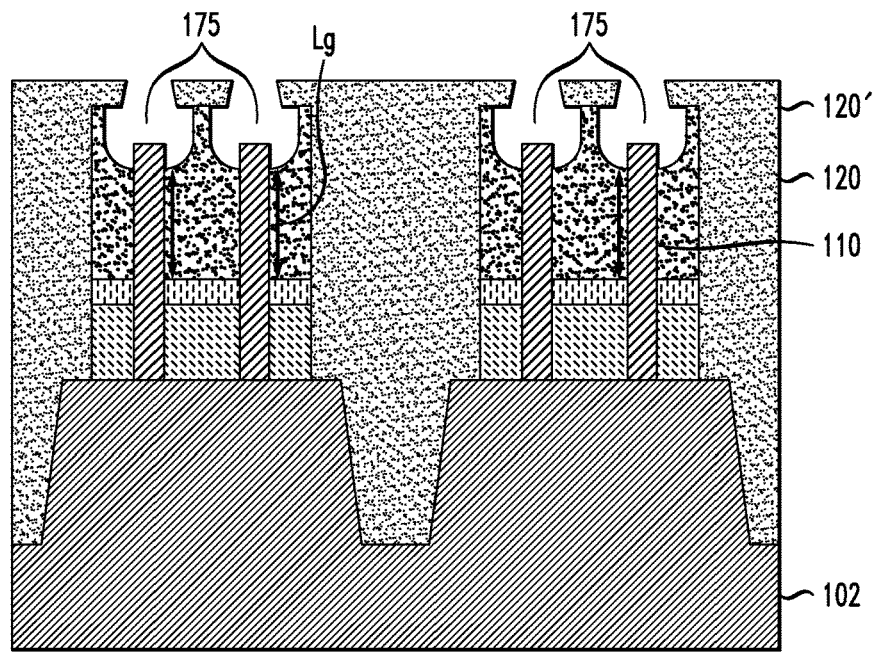
FIG. 9 is a cross-sectional view of gate structure recessing in a method of manufacturing a semiconductor device, according to an exemplary embodiment of the present invention.

FIG. 9 is a cross-sectional view of gate structure recessing in a method of manufacturing a semiconductor device, according to an exemplary embodiment of the present invention. Referring to FIG. 9, portions of the gate structure 150 are removed using, for example, for example, an isotropic etch process, which is a wet or chemical etch that etches exposed regions laterally (from sides) and vertically (from a top surface down) to form U-shaped openings 175. The etch process can include, but is not necessarily limited to hot SC-1 ($NH_4OH:H_2O_2:H_2O$). As can be seen, the gate structure 150 is recessed to a height below an upper surface of the fins 110, and the resulting gate length (Lg) based on the gate structure height is the same or substantially the same at each fin 110. The gate length (Lg) is the same or substantially the same on each side of the fins 110 (e.g., on sides between adjacent fins 110 in a gate region, and on outer sides of the fins 110 in the gate regions). This uniform or substantially uniform gate length (Lg) is due to the openings 165 having the same or substantially the same size to eliminate or minimize any loading effect. As a result, the gate structure 150 can be uniformly recessed to the same or substantially the same height in the same etch process across all fins 110. Depending on design constraints, the resulting gate length (Lg) can vary. For example, a range of the gate length (Lg) includes, but is not necessarily limited to, about 8 nm to about 50 nm. The gate structure 150 is selectively removed with respect to the fins 110 and the dielectric layer 120'.

Figure 10:
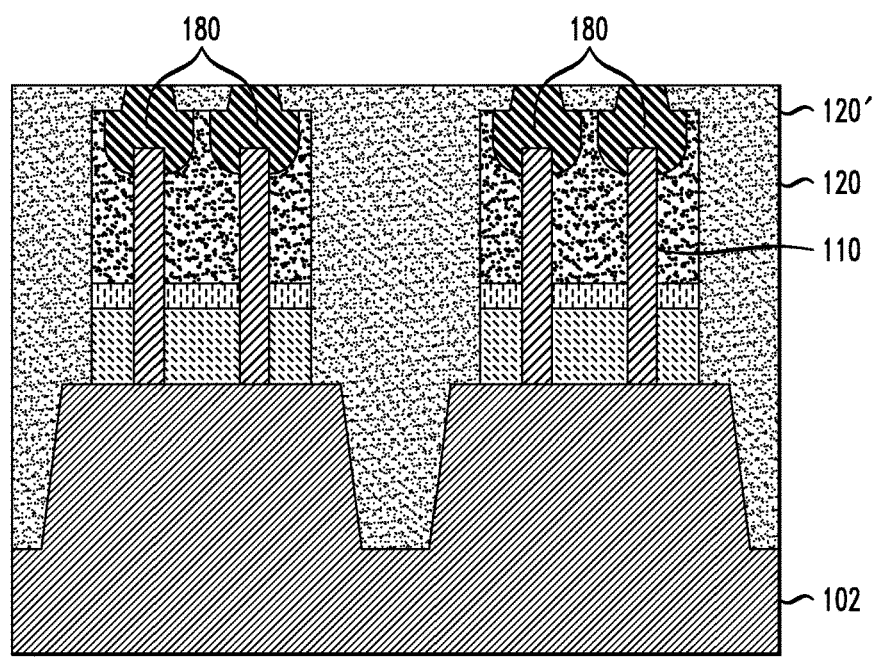
FIG. 10 is a cross-sectional view of top spacer material deposition in a method of manufacturing a semiconductor device, according to an exemplary embodiment of the present invention.

FIG. 10 is a cross-sectional view of top spacer material deposition in a method of manufacturing a semiconductor device, according to an exemplary embodiment of the present invention. Referring to FIG. 10, top spacer material 180 is deposited in the openings 175 and on the dielectric layer 120', and planarized down to the dielectric layer 120' using, for example, CMP. The top spacer material 180 includes, but is not necessarily limited to, SiOC, SiBCN, SiOCN, SiOBCN, SiN or other material that can be selectively removed with respect to the dielectric layer 120' (or with respect to both dielectric layers 120, 120'). The top spacer material 180 can be deposited using, for example, deposition techniques including, but not limited to, CVD, PECVD, RFCVD, PVD, ALD, MLD, MBD, PLD, LSMCD and/or sputtering.

Figure 11:
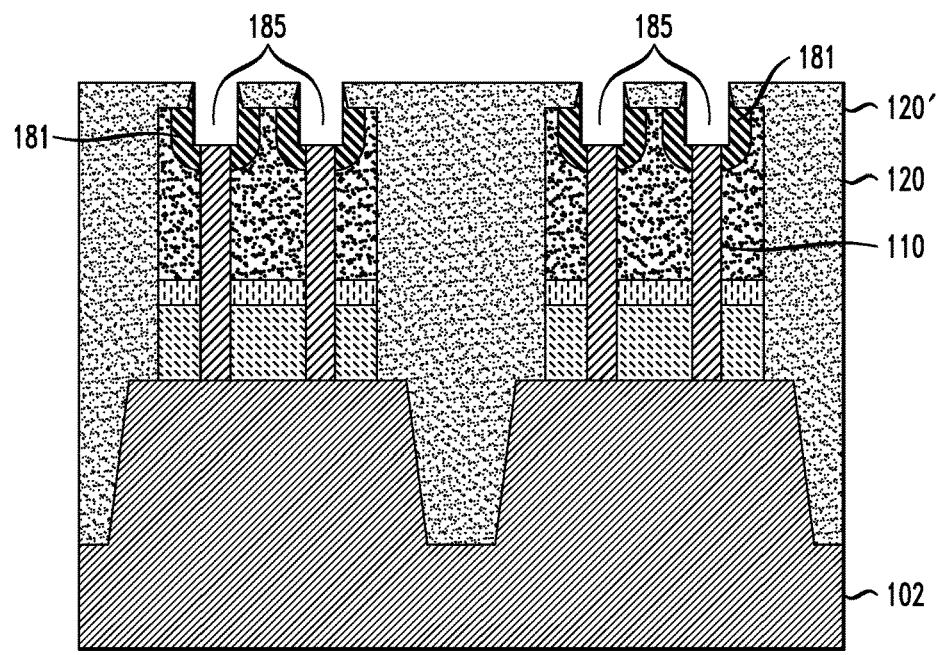
FIG. 11 is a cross-sectional view of top spacer etching and fin reveal in a method of manufacturing a semiconductor device, according to an exemplary embodiment of the present invention.

FIG. 11 is a cross-sectional view of top spacer etching and fin reveal in a method of manufacturing a semiconductor device, according to an exemplary embodiment of the present invention. Referring to FIG. 11, the top spacer material 180 is etched using for example, an anisotropic etching process, such as, but not necessarily limited to, RIE or other type of directional etching, to form top spacers 181 and openings 185 exposing top surfaces of the fins 110. The etch process can include, but is not necessarily limited to $CH_3F$. As can be seen, portions of the spacer material that are not removed are covered by the dielectric layer 120', and therefore are protected from the directional etching. The resulting top spacers 181 isolate the gate structures 150 from the top source/drain regions 190 described in connection with FIG. 12.

Figure 12:
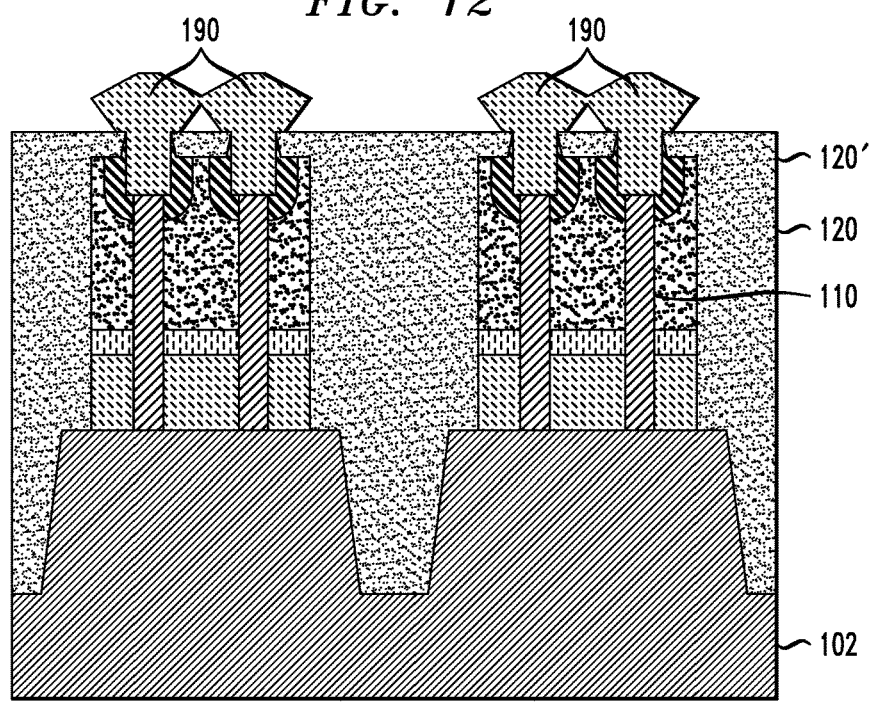
FIG. 12 is a cross-sectional view of top source/drain formation in a method of manufacturing a semiconductor device, according to an exemplary embodiment of the present invention.

FIG. 12 is a cross-sectional view of top source/drain formation in a method of manufacturing a semiconductor device, according to an exemplary embodiment of the present invention. Referring to FIG. 12, top source/drain regions 190 are formed on the fins 110 in the openings 185 and on a top surface of the dielectric layer 120'. The top source/drain regions 190 can be formed by a bottom-up epitaxial growth process, wherein the top source/drain regions 190 are grown to certain height (thickness) where the source/drain regions 190 of adjacent fins in each gate region G1 and G2 may or may not contact each other to form a VFET in each gate region G1 and G2. A height (thickness) range of the source/drain regions 190 with respect to the top surface of the fins 110 can be, but is not necessarily limited to about 10 nm to about 50 nm. The epitaxially grown top source/drain regions 190 can be doped using processes, such as, for example, ion implantation, in situ, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1e18/cm^3$ to $1e21/cm^3$.

As can be understood further downstream processing can be performed to form inter-level dielectric (ILD) layers and electrically conductive contact regions to gate structures and source/drain regions.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a plurality of fins on a substrate, wherein a hardmask is formed on each of the plurality of fins;
    forming a gate structure around the plurality of fins;
    selectively depositing a dummy dielectric on the hardmask on each of the plurality of fins;
    depositing a dielectric layer on the gate structure and around the dummy dielectric;
    selectively removing the dummy dielectric and the hardmask with respect to the dielectric layer and the gate structure to create a plurality of openings exposing portions of the gate structure; and
    selectively removing the exposed portions of the gate structure through the plurality of the openings.

2. The method according to claim 1, wherein the dummy dielectric is selectively deposited using selective atomic layer deposition (ALD).

3. The method according to claim 1, wherein the dummy dielectric and the hardmask each comprise a nitride.

4. The method according to claim 3, wherein the dielectric layer comprises an oxide.

5. The method according to claim 1, wherein the plurality of openings exposing portions of the gate structure are a same or substantially a same size.

6. The method according to claim 1, wherein the selective removal of the exposed portions of the gate structure recesses the gate structure to a same or substantially a same height around each of the plurality of fins.

7. The method according to claim 1, further comprising:
    forming a lower dielectric layer on the substrate and around the plurality of fins prior to forming the gate structure; and
    removing portions of the lower dielectric layer around the plurality of fins prior to forming the gate structure.

8. The method according to claim 7, wherein the dielectric layer deposited on the gate structure and around the dummy dielectric is further deposited on the lower dielectric layer.

9. The method according to claim 7, further comprising forming a source/drain region on the substrate and around the plurality of fins after removal of the portions of the lower dielectric layer.

10. The method according to claim 9, further comprising forming a spacer layer on the source/drain region.

11. The method according to claim 10, wherein the gate structure is formed on the spacer layer.

12. The method according to claim 1, wherein the selective removal of the exposed portions of the gate structure is performed using isotropic etching.

13. The method according to claim 1, further comprising depositing a spacer material on each of the plurality of fins in place of the selectively removed portions of the gate structure and the selectively removed dummy dielectric and the hardmask.

14. The method of according to claim 13, further comprising removing a first portion of the spacer material, wherein a second portion of the spacer material is covered by the dielectric layer.

15. The method according to claim 14, further comprising forming a source/drain region on each of the plurality of fins in place of the removed first portion of the spacer material.

16. A method for manufacturing a semiconductor device, comprising:
    forming a plurality of fins on a substrate, wherein a hardmask is formed on each of the plurality of fins;
    forming a gate structure around the plurality of fins;
    selectively depositing a dummy dielectric on the hardmask on each of the plurality of fins;
    depositing a dielectric layer on the gate structure and around the dummy dielectric;
    selectively removing the dummy dielectric and the hardmask with respect to the dielectric layer and the gate structure to create a plurality of openings exposing portions of the gate structure; and
    recessing the exposed portions of the gate structure through the plurality of the openings to a same or substantially a same height around each of the plurality of fins.

17. The method according to claim 16, wherein the plurality of openings exposing portions of the gate structure are a same or substantially a same size.

* * * * *